(12) United States Patent
Kim et al.

(10) Patent No.: US 10,775,872 B2
(45) Date of Patent: Sep. 15, 2020

(54) METHOD AND APPARATUS FOR MANAGING BATTERY OF ELECTRONIC DEVICE

(71) Applicant: Samsung Electronics Co., Ltd., Gyeonggi-do (KR)

(72) Inventors: Hyun Seok Kim, Gyeonggi-do (KR); Yong Seung Yi, Seoul (KR); Du Hyun Kim, Gyeonggi-do (KR); Yong Jae Lee, Gyeonggi-do (KR); Ho Yeong Lim, Gyeonggi-do (KR); Byeong Bae Hyeon, Gyeonggi-do (KR); Dong Il Son, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 278 days.

(21) Appl. No.: 15/916,794

(22) Filed: Mar. 9, 2018

(65) Prior Publication Data

US 2018/0260019 A1   Sep. 13, 2018

(30) Foreign Application Priority Data

Mar. 10, 2017 (KR) .......................... 10-2017-0030774

(51) Int. Cl.
*G06F 1/3287* (2019.01)
*H02J 7/00* (2006.01)
(Continued)

(52) U.S. Cl.
CPC ....... *G06F 1/3287* (2013.01); *G01R 31/3828* (2019.01); *G06F 1/263* (2013.01); *G06F 1/3209* (2013.01); *H02J 7/0021* (2013.01)

(58) Field of Classification Search
CPC ...... G06F 1/3287; G06F 1/263; G06F 1/3209; G06F 1/26; G01R 31/3828; H02J 7/0021; H02J 7/00
See application file for complete search history.

(56) References Cited

U.S. PATENT DOCUMENTS 6,342,738 B1 * 1/2002 Lutnaes .............. H04M 1/0214
                                                    307/125
6,388,343 B1   5/2002 Michigami et al.
(Continued)

FOREIGN PATENT DOCUMENTS

EP   2336843 A2   6/2011
EP   3098687 A1   11/2016
(Continued)

OTHER PUBLICATIONS

International Search Report dated Jun. 22, 2018.
European Search Report dated Feb. 7, 2020.

*Primary Examiner* — Robert L Deberadinis
(74) *Attorney, Agent, or Firm* — Cha & Reiter, LLC.

(57) ABSTRACT

An electronic device includes a power management circuit which supplies power from a battery to electronic components, a battery management circuit which controls connection between the battery and the power management circuit, a physical key formed on a part of the electronic device, a key control circuit which controls connection between the physical key and the battery management circuit, and a processor connected to the power management circuit. The processor is configured to transmit a signal for powering off the electronic device to the power management circuit, and when the electronic device is powered off, to control the key control circuit to connect the physical key with the battery management circuit. The power management circuit is configured to, when receiving the signal for powering off the electronic device, control the battery management circuit to (Continued)

disconnect the battery from the one or more electronic components included in the electronic device.

20 Claims, 16 Drawing Sheets

(51) Int. Cl.
 *G06F 1/26* (2006.01)
 *G06F 1/3209* (2019.01)
 *G01R 31/3828* (2019.01)

(56) References Cited

U.S. PATENT DOCUMENTS

| | | |
|---|---|---|
| 6,765,369 B2 | 7/2004 | Rhee et al. |
| 6,984,900 B1 * | 1/2006 | Bruwer .................. H05B 47/16 |
| | | 307/87 |
| 8,282,009 B2 | 10/2012 | Ahn et al. |
| 8,736,116 B2 | 5/2014 | Yoshie |
| 9,059,597 B2 | 6/2015 | Woo et al. |
| 9,208,981 B2 | 12/2015 | Yoshie |
| 9,338,749 B2 | 5/2016 | Kim |
| 2003/0122524 A1 | 7/2003 | Rhee et al. |
| 2008/0237355 A1 | 10/2008 | Ahn et al. |
| 2012/0213135 A1 | 8/2012 | Woo et al. |
| 2012/0315960 A1 | 12/2012 | Kim et al. |
| 2013/0015249 A1 | 1/2013 | Ahn et al. |
| 2016/0349831 A1 | 12/2016 | Lim |

FOREIGN PATENT DOCUMENTS

| | | |
|---|---|---|
| KR | 10-2008-0087543 A | 10/2008 |
| KR | 10-2012-0096865 A | 8/2012 |

* cited by examiner

METHOD AND APPARATUS FOR MANAGING BATTERY OF ELECTRONIC DEVICE

CROSS-REFERENCE TO RELATED APPLICATION(S)

This application is based on and claims priority under 35 U.S.C. § 119 to Korean Patent Application No. 10-2017-0030774, filed on Mar. 10, 2017, in the Korean Intellectual Property Office, the disclosure of which is incorporated by reference herein its entirety.

BACKGROUND

1. Field

The present disclosure generally relates to a technology for blocking leakage current consumed by a battery when an electronic device is not operating.

2. Description of Related Art

Batteries are included in electronic devices to power various electronic components of the electronic devices. When an electronic device is powered off, the electronic device may stop supplying power from its battery to the various electronic components to prevent unnecessary power consumption.

However, when the battery is integrated or embedded in the electronic device, even when the electronic device is not operating, a leakage current of a certain level flows from the battery to the electronic components electrically connected to the battery.

The above information is presented as background information only to assist with an understanding of the present disclosure. No determination has been made, and no assertion is made, as to whether any of the above might be applicable as prior art with regard to the present disclosure.

SUMMARY

When this leakage current exists, and when the electronic device is powered off for a long period of time, such as when it is stored in storage from when it is shipped from the manufacturer to when it is sold, the leakage current may cause the battery voltage to slowly decrease. As such, the consumer who purchased the electronic device may have to put up with the inconvenience of having to first charge the device after purchase before the device can be used. Further, when the leakage current is excessive, the user may receive a device upon purchase that is already damaged.

An existing solution to block the leakage current is to cut off the path generating the leakage current. This may be done by, for example, controlling a switch in the path with a specific command. The reverse of the command may be used to re-establish the path under specified conditions (e.g., when the electronic device is powered on). However, these commands to control the internal switches of the electronic device may be only known to manufacturers or distributors of the device, and therefore the consumer or buyer may not be able to control the path generating the leakage current.

Aspects of the present disclosure are to address at least the above-mentioned problems and/or disadvantages and to provide at least the advantages described below. Accordingly, an aspect of the present disclosure is to provide an apparatus and a method for repeatedly cutting off or preventing a leakage current of a battery whenever an electronic device is powered off.

In accordance with an aspect of the present disclosure, an electronic device may include a power management circuit to supply power from a battery to one or more electronic components included in the electronic device, a battery management circuit to control connection between the battery and the power management circuit, a physical key formed on a part of the electronic device, a key control circuit to control connection between the physical key and the battery management circuit, and a processor connected to the power management circuit. The processor may be configured to transmit a signal for powering off the electronic device to the power management circuit, and when the electronic device is powered off, control the key control circuit to connect the physical key with the battery management circuit. The power management circuit may be configured to when receiving the signal for powering off the electronic device, control the battery management circuit to disconnect the battery from the one or more electronic components included in the electronic device.

In accordance with another aspect of the present disclosure, an electronic device may include a housing, a physical key having at least a part coupled to the housing, one or more electronic components including at least one processor, a battery to supply power to the one or more electronic components, a battery management circuit to control connection between the battery and the one or more electronic components, and a key control circuit to control connection between the physical key and the battery management circuit. The at least one processor may be configured to control the key control circuit to connect the physical key with the battery management circuit, in response to occurrence of a specified event, and control the battery management circuit to disconnect the battery from the one or more electronic components. The battery management circuit may be configured to, in response to a first input signal from the physical key, connect the battery with the one or more electronic components or disconnect the battery from the one or more electronic components.

In accordance with another aspect of the present disclosure, an electronic device may include a housing, a physical key having at least a part coupled to the housing, one or more electronic components including a processor, a battery to supply power to the one or more electronic components, a battery management circuit to control connection between the battery and the one or more electronic components, and a key control circuit to control connection between the physical key and the battery management circuit. When a specified condition is satisfied and the electronic device is powered off, the battery management circuit may be configured to control the key control circuit to connect the physical key with the battery management circuit, and disconnect the battery from the one or more electronic components.

According to various embodiments of the present disclosure, the leakage current may be prevented from being generated from the battery when the electronic device is powered off.

In addition, according to various embodiments, the leakage current is repeatedly blocked whenever the electronic device is powered off.

In addition, other features, attributes, and/or advantages directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 6A, 6B, and 6C are schematic diagrams illustrating various circuit configurations when the electronic device is powered on;

In the following description made with respect to the accompanying drawings, the same or similar elements will be assigned the same or similar reference numerals.

DETAILED DESCRIPTION

Hereinafter, various embodiments of the present disclosure may be described with reference to accompanying drawings. Accordingly, those of ordinary skill in the art will recognize that modifications, equivalents, and/or alternatives of the various embodiments described herein can be variously made without departing from the scope and spirit of the present disclosure.

Various embodiments of the present disclosure may apply to an electronic device 100 having a battery 110 embedded therein. For example, the various embodiments may be applicable to a battery-embedded smartphone, tablet PC, a notebook PC, smart watch, or the like. The electronic device 100 may include a display 103. For convenience of explanation and illustration purposes, the following descriptions are made in the context of a user terminal such as a smartphone having the display 103.

Figure 1:
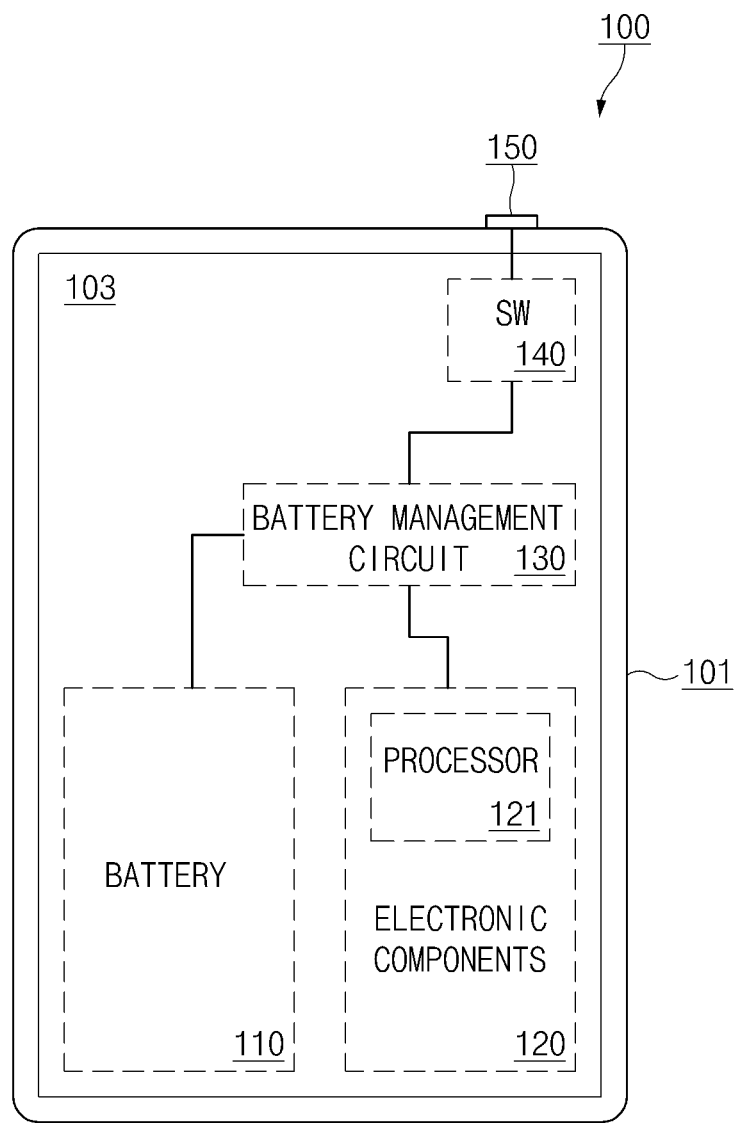
FIG. 1 is a view illustrating an electronic device, according to an embodiment.

FIG. 1 is a view illustrating an electronic device, according to an embodiment.

Referring to FIG. 1, the electronic device 100 (e.g., the electronic device 1201 of FIG. 12) may include a housing 101, the display 103 partially exposed through a front surface of the housing 101, and a physical key 150 (e.g., a power key, a home button, or the like) exposed through a part (e.g., a side surface) of the housing 101. The physical key 150 may be inserted through an opening of the housing 101. In addition, the housing 101 of the electronic device 100 may include the battery 110 (e.g., the battery 1289 of FIG. 12), various electronic components 120, a battery management circuit 130, and a key control circuit 140 (e.g., a key switch). For reference, in FIG. 1, internal elements of the electronic device 100 are shown in dotted lines.

The battery 110 may supply power to the electronic components 120 through the battery management circuit or a battery management system (BMS) 130. According to an embodiment, the electronic device 100 may supply power from the battery 110 to the electronic components 120 through another control circuit that is not illustrated in FIG. 1. For example, an always on system 160 (shown in FIG. 7) may be connected to the battery 110 through another control circuit instead of the battery management circuit 130. This way, the always on system 160 may receive power from the battery 110 even if the electronic device 100 is powered off. In another example, the always on system 160 may be directly connected to the battery 110 without an intervening control circuit.

The electronic components 120 may be various components of the electronic device 100 that receive power from the battery 110. For example, the electronic components 120 may include an application processor (AP), a communication processor (CP), a power management circuit (or a system power management block), a camera, and a sensor. In the present disclosure, the control circuit may be referred to as "at least one processor 121." The at least one processor 121 may include, for example, a main processor 123 and a power management circuit 125. Circuit elements including the main processor 123 and the power management circuit 125 will be described below with reference to FIG. 4. The at least one processor 121 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C.

§ 112(f) unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the physical key 150 may be connected to the battery management circuit 130 via the key control circuit 140. When the physical key 150 is connected to the battery management circuit 130 through the key control circuit 140, an input event may be transmitted from the physical key 150 to the battery management circuit 130. When the physical key 150 is disconnected from the battery management circuit 130 by the key control circuit 140, the input event may be blocked According to an embodiment, the battery management circuit 130 may electrically disconnect the battery 110 from the electronic components 120. When the battery management circuit 130 electrically disconnects the battery 110 from the electronic components 120, leakage current from the battery 110 to the electronic components 120 may be blocked.

In the present disclosure, an "electrical disconnection" may refer to electrical and physical isolation between two elements.

Figure 2:
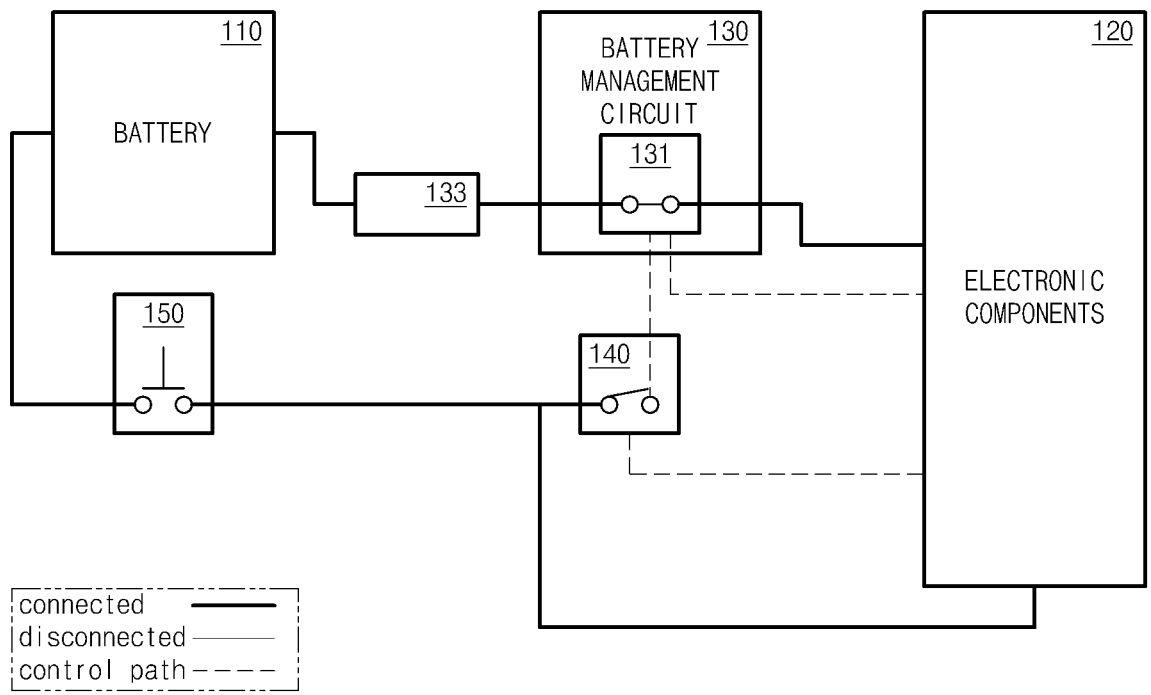
FIG. 2 is a schematic diagram illustrating a circuit configuration of an electronic device in a powered-on state, according to an embodiment.

FIG. 2 is a schematic diagram illustrating a circuit configuration of the electronic device 100 in a powered-on state, according to an embodiment. Hereinafter, elements of FIG. 2 and the other drawings, which have the same reference numerals as those of elements in the electronic device 100 illustrated FIG. 1 may be understood as elements the same as or corresponding to the elements of FIG. 1.

When the electronic device 100 is powered on, a path for connecting the battery 110, the battery management circuit 130, and the electronic components 120 may be electrically established. For example, the battery management circuit 130 may be interposed between the battery 110 and the electronic components 120 and may connect the battery 110 with the electronic components 120. For illustration purposes, in FIG. 2 and other drawings, connection paths, disconnection paths, and control paths of transmitting control messages are shown in bold solid lines, solid lines, and dotted lines, respectively. However, the connection relation and the manner of expressing the connection relation defined in the present disclosure are provided only for the illustrative purpose, but the present disclosure is not limited thereto. In other words, various modified connection relations and manners of expressing the same are possible by those skilled in the art.

When the electronic device 100 is powered on, a battery power switch (BPS) 131 in the battery management circuit 130 may be closed. When the BPS 131 is closed, the electrical connection between the battery 110 and the electronic components 120 may be established.

According to an embodiment, the BPS 131 may be a separate component apart from the battery management circuit 130 (e.g., outside the battery management circuit 130). In addition, according to an embodiment, a monitoring circuit 133, which monitors the voltage/current of the battery 110, may be positioned outside the battery management circuit 130 or may be implemented integrally with the battery management circuit 130. In other words, the battery management circuit 130, the BPS 131, and the monitoring circuit 133 may be integrally implemented or may be implemented components separate from each other.

When the electronic device 100 is powered on, the key control circuit 140, which is interposed between the physical key 150 and the battery management circuit 130, may disconnect the physical key 150 from the battery management circuit 130. This disconnection may prevent the physical key 150 from changing the state of the BPS 131 (e.g., changed from on state to off state). In this state, when an input occurs through the physical key 150, for example when the physical key 150 is depressed, the input may be transmitted to the electronic components 120 through a path of connecting the physical key 150 with the electronic components 120. For example, the at least one processor 121 may perform a predefined operation in response to the input. For example, when the physical key 150 is short pressed (e.g., pressed for less than 1 sec.), the at least one processor 121 may turn off the display 103 of the electronic device 100. For another example, when the physical key 150 is long pressed (e.g., pressed for 2 sec. or more), the electronic device 100 may perform a power-off operation.

According to an embodiment, when a power-off event occurs, the electronic device 100 may transition from the power-off state to the power-on state. For example, when the input through the physical key 150 is maintained for a specified time or more (e.g. when the input is a long press), or when a power-off input is detected through a user interface displayed on the display 103, the at least one processor 121 may perform the power-off operation. According to an embodiment, the power-off operation will be described below with reference to FIGS. 3 and 4.

Figure 3:
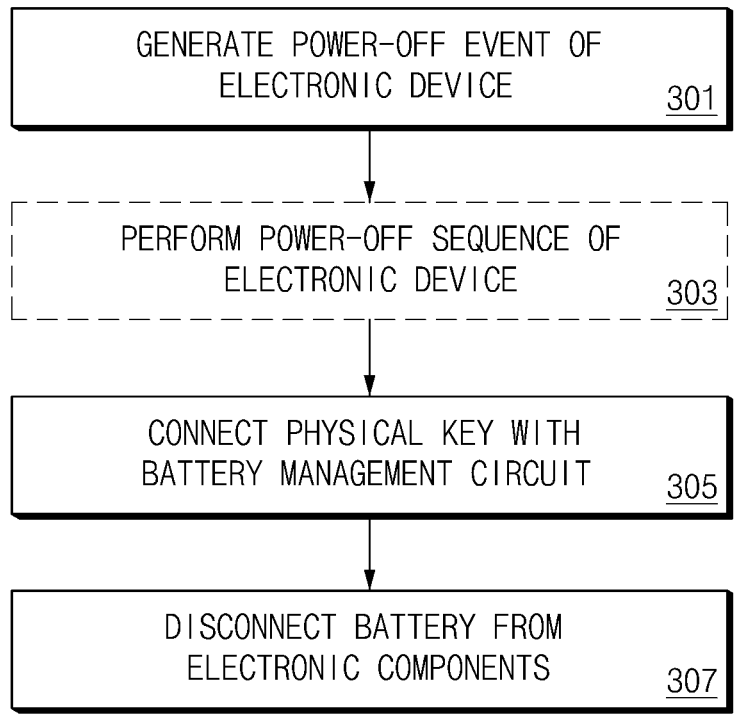
FIG. 3 is a flowchart illustrating a power-off process of an electronic device, according to an embodiment.
Figure 4:
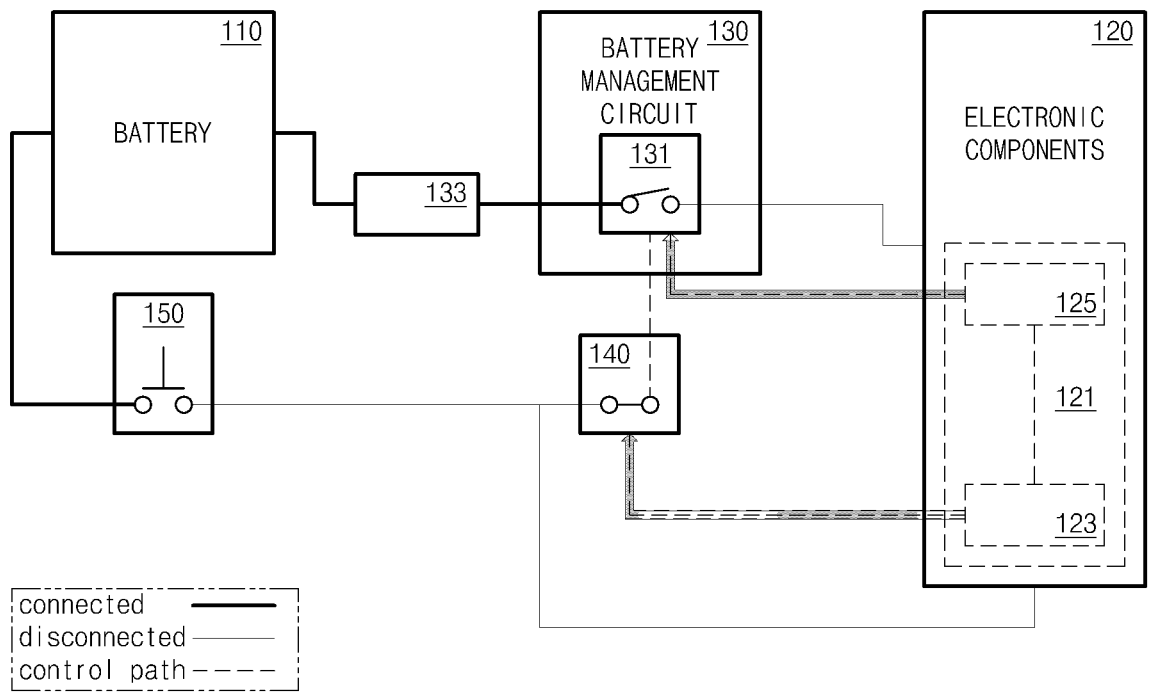
FIG. 4 is a schematic diagram illustrating a circuit configuration of an electronic device in a powered-off state, according to an embodiment.

FIG. 3 is a flowchart illustrating a power-off process of the electronic device 100, according to an embodiment. FIG. 4 is a schematic diagram illustrating a circuit configuration of the electronic device 100 in the powered-off state, according to an embodiment.

Referring to FIGS. 3 and 4, in operation 301, a power-off event of the electronic device 100 to power off the electronic device 100 may occur. The at least one processor 121 of the electronic device 100 may perform a series or sequence of operations to power off the electronic device 100 in operation 303, in response to the power-off event. For example, the at least one processor 121 may store data being edited, may terminate running application(s), and may deactivate active components in the electronic components 120. The power-off sequence of the electronic device 100 may vary depending on manufacturer and operating system. If the electronic device 100 is forcibly powered off, the power-off sequence of operation 303 may be entirely or partially omitted.

In operation 305, the at least one processor 121 may connect the physical key 150 with the battery management circuit 130 by using the key control circuit 140, in response to the power-off event.

In operation 307, the at least one processor 121 may release the connection between the battery 110 and the electronic components 120 by using the battery management circuit 130. For example, the at least one processor 121 may open a switch in the battery management circuit 130 so that the battery 110 is disconnected from the electronic components 120.

According to an embodiment, operation 307 may be performed after operation 305. However, according to other embodiments, operation 307 may be performed before operation 305, or operations 305 and operation 307 may be performed substantially simultaneously.

According to an embodiment, the at least one processor 121 may include the main processor 123 (e.g., an AP) and the power management circuit 125. The main processor 123 and the power management circuit 125 may be integrally implemented into a system on chip (SoC) or may be implemented separately from each other. Here, for illustration purposes only, the main processor 123 and the power management circuit 125 are shown as integrated components of the at least one processor 121. According to an embodiment, the power management circuit 125 may receive power from the battery 110 through the battery management circuit 130 and may supply the received power to various remaining parts of the electronic components 120.

According to an embodiment, the main processor 123 may transmit a signal for powering off the electronic device 100 to the power management circuit 125. In addition, when the electronic device 100 is powering off, the main processor 123 may connect the physical key 150 with the battery management circuit 130 by using the key control circuit 140. This procedure may correspond to operation 305 described above.

According to an embodiment, based on receiving the signal for powering off the electronic device 100 from the main processor 123, the power management circuit 125 may disconnect the battery 110 from the power management circuit 125 by using the battery management circuit 130. This procedure may correspond to operation 307.

According to various embodiments, the operations of the main processor 123 and the power management circuit 125 may be integrated into operations of the main processor 123 and may be performed independently from each other. In the present disclosure, the following description will be made regarding that a power on/off process is performed by at least one processor 121 as the main processor 123 and the power management circuit 125 are included/integrated.

Referring to FIG. 4, according to an embodiment where the electronic device 100 is powered off, it may be recognized that the BPS 131 is open and thus the battery 110 is disconnected from the electronic components 120. In addition, this disconnection between the battery 110 and the electronic components 120 may be maintained until a power-on input is received the physical key 150. Accordingly, leakage current between the battery 110 and the electronic components 120 may be blocked.

In addition, since the key control circuit 140 is connected to the battery management circuit 130 (or the BPS 131), the key control circuit 140 may transmit inputs made through the physical key 150 to the battery management circuit 130. Therefore, the battery management circuit 130 may connect the battery 110 to the electronic components 120 when the corresponding input is received from the physical key 150 connected to the key control circuit 140. Therefore, according to various embodiments, after all physical/electrical connections between the battery 110 and the electronic components 120 are severed so that leakage currents are blocked, these physical/electrical connections may be established again when the appropriate input is detected through the physical key 150. Accordingly, the user of the electronic device 100 may control the blocking of leakage currents.

According to an embodiment, when a power-on event of the electronic device 100 occurs, the electronic device 100 may transition to the powered-on state from the powered-off state. The following description will be made with reference to FIGS. 5, 6A, 6B, and 6C regarding the flow of power when the electronic device 100 is powered on and the relevant control messages.

Figure 5:
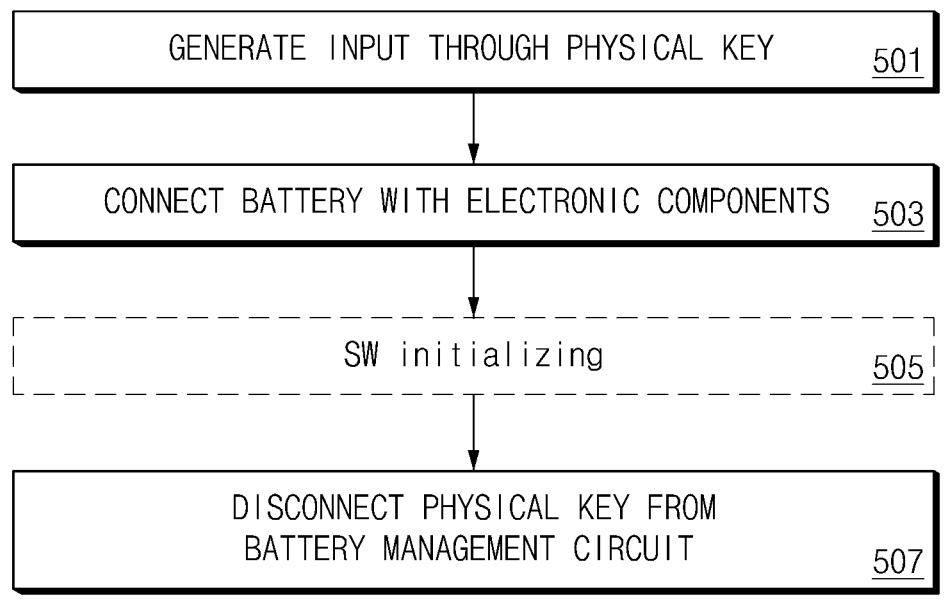
FIG. 5 is a flowchart illustrating a power-on process of an electronic device, according to an embodiment.
Figure 6A:
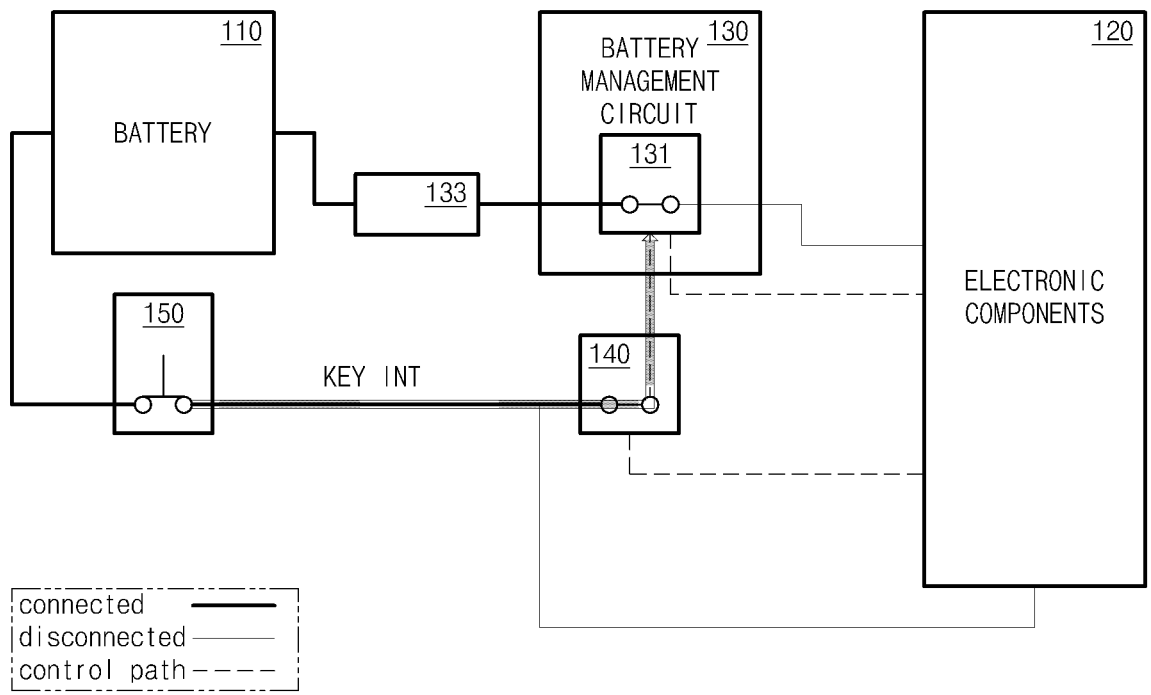
Figure 6B:
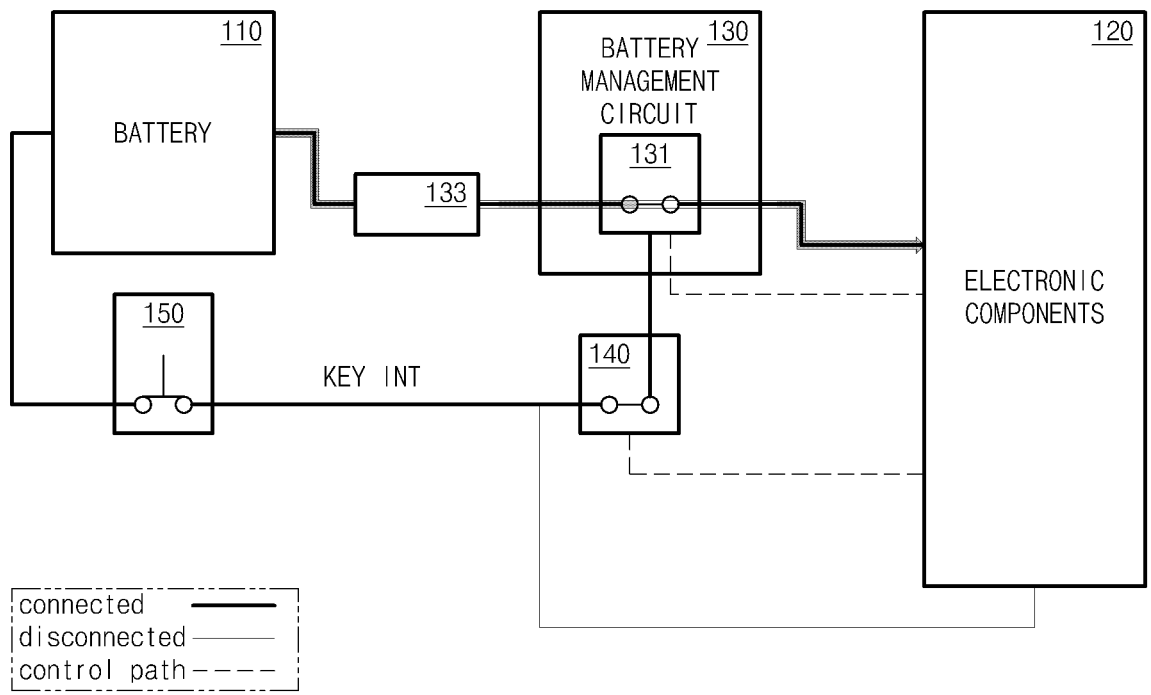
Figure 6C:
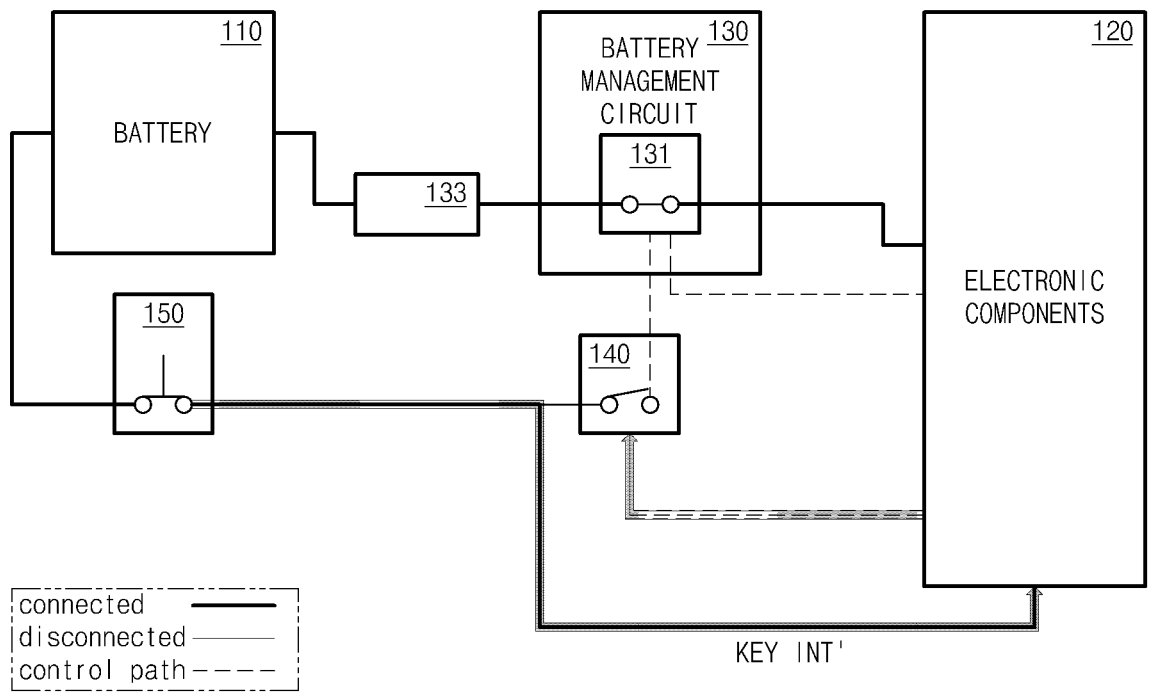

FIG. 5 is a flowchart illustrating a power-on process of the electronic device 100, according to an embodiment. FIGS. 6A, 6B, and 6C are schematic diagrams illustrating the various circuit configurations when the electronic device 100 is powered on.

Referring to FIGS. 5 and 6A, an input through the physical key 150 may occur in operation 501. As illustrated in FIG. 4, when the electronic device 100 is powered off, the physical key 150 and the battery management circuit 130 connected to each other by the key control circuit 140. Accordingly, when a user input occurs through the physical key 150, for example an input to power on, a control message (e.g., a key interrupt) corresponding to the user input may be transmitted to the battery management circuit 130. In one example, when receiving the control message, the battery management circuit 130 may control the BPS 131 (e.g., switch on) such that the battery 110 is connected to the electronic components 120 in operation 503.

When the battery 110 is connected to the electronic components 120, the power of the battery 110 may be supplied to the electronic components 120, as shown in FIG. 6B.

According to an embodiment, when power is supplied to the at least one processor 121 and the electronic components 120, the electronic device 100 may perform an initializing operation in operation 505. The initializing operation may correspond to, for example, a booting procedure of the electronic device 100. For example, the electronic device 100 may determine the types and the states of the electronic components 120 connected to the main processor 123 and may perform operations of loading user information, loading user settings, and loading system setting values stored in the memory of the electronic device 100.

According to another embodiment, the initializing operation may be performed when an input is continuously made through the physical key 150 for a predefined time (e.g., 2 secs.) or more. For example, when the input through the physical key 150 is for less than the predefined time, the electronic device 100 may establish the power supply path as illustrated in FIG. 6B. However, because the input through the physical key 150 is not continuously made for the predefined time or more, the at least one processor 121 or the battery management circuit 130 may control the switch 131 and key control circuit 140 to return to the powered-off state as illustrated in FIG. 4.

Referring to FIGS. 5 and 6C, when the initializing operation is entirely or partially complete, the at least one processor 121 may control the key control circuit 140 such that the connection between the physical key 150 and the battery management circuit 130 is released in operation 507. Accordingly, when the electronic device 100 enters the powered-on state, the at least one processor 121 may prevent the input through the physical key 150 from affecting the battery management circuit 130 or the BPS 131. With the connection between the physical key 150 and the battery management circuit 130 released, inputs through the physical key 150 may be transmitted to the electronic components 120 such as the at least one processor 121. Accordingly, the electronic device 100 may perform various control operations (e.g., operations to turn off the display 103) as dictated by inputs from the physical key 150.

According to an embodiment of the present disclosure, since the battery management circuit 130 manages the connection between the battery 110 and the electronic components 120, when the input through the physical key 150 affects the battery management circuit 130 in the powered-on state, device shut-down may suddenly occur when the battery 110 is disconnected to the electronic components 120. Accordingly, to improve stability, during the powered-on state and after booting, by using the key control circuit 140, the physical key 150 may be disconnected from the battery management circuit 130.

The electronic device 100 may further include an always on system 160 that is on even when the rest of the electronic device 100 is powered off. For example, when the electronic components 120 supports wireless payments using near field communication (NFC) or magnetic signal transmission (MST). To support such functions, the electronic device 100 may include an always on system 160 so that the user can perform wireless payments even if the rest of the electronic device 100 is powered off.

According to an embodiment, even if the rest of electronic device 100 is powered off, power from the battery 110 may be supplied to the always on system 160. For example, the always on system 160 may be connected to the battery 110 through the battery management circuit 130 or the BPS 131 and another control circuit (e.g., a BPS 135).

According to another embodiment, power supplied to the always on system 160 may be cut off depending on the capacity of the battery 110 or the state of the battery voltage.

Figure 7:
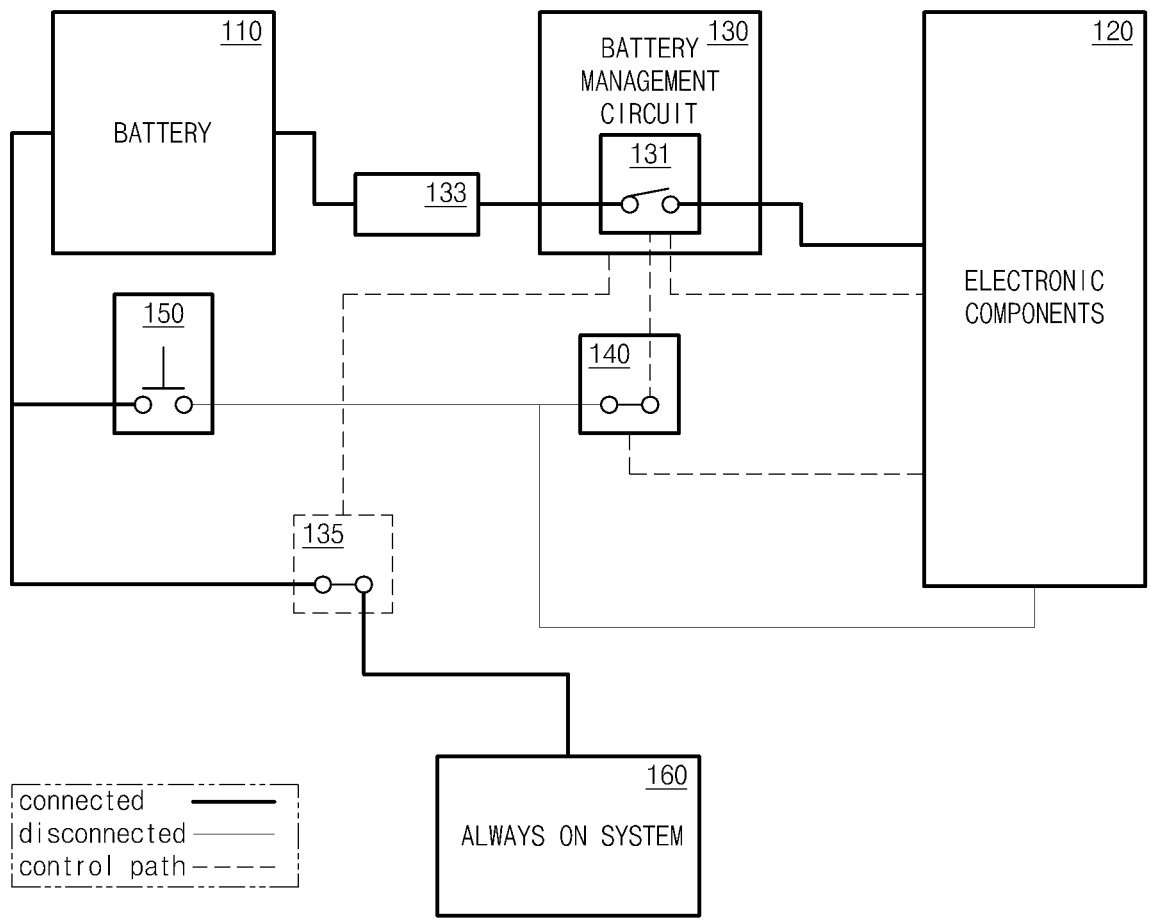
FIG. 7 is a schematic diagram illustrating a circuit configuration of an electronic device that includes an always on system, according to an embodiment.

FIG. 7 is a schematic diagram illustrating a circuit configuration of the electronic device 100 including the always on system 160, according to an embodiment. FIG. 7 illustrates an example circuit configuration when the electronic device 100 including the always on system 160 is powered off. When compared with the embodiment described with reference to FIG. 4, the electronic device 100 may additionally include the always on system 160 and the BPS 135. For distinguishing between the BPS 131 and the BPS 135, the BPS 131 may be referred to as the first switch 131 and the BPS 135 may be referred to as the second switch 135.

According to an embodiment, the second switch 135 may be omitted. When the second switch 135 is omitted, the battery 110 may be always connected to the always on system 160. According to another embodiment, the battery management circuit 130 may control the second switch 135 to disconnect the always on system 160 from the battery 110. The embodiment related to the above description will be described below.

According to an embodiment, when the remaining capacity of the battery 110 is lower than a specific level or threshold, the electronic device 100 may be powered off. Hereinafter, the operation of the electronic device 100 that variously includes and does not include the always on system 160 will be described with reference to FIGS. 7, 9A, and 9B.

Figure 8:
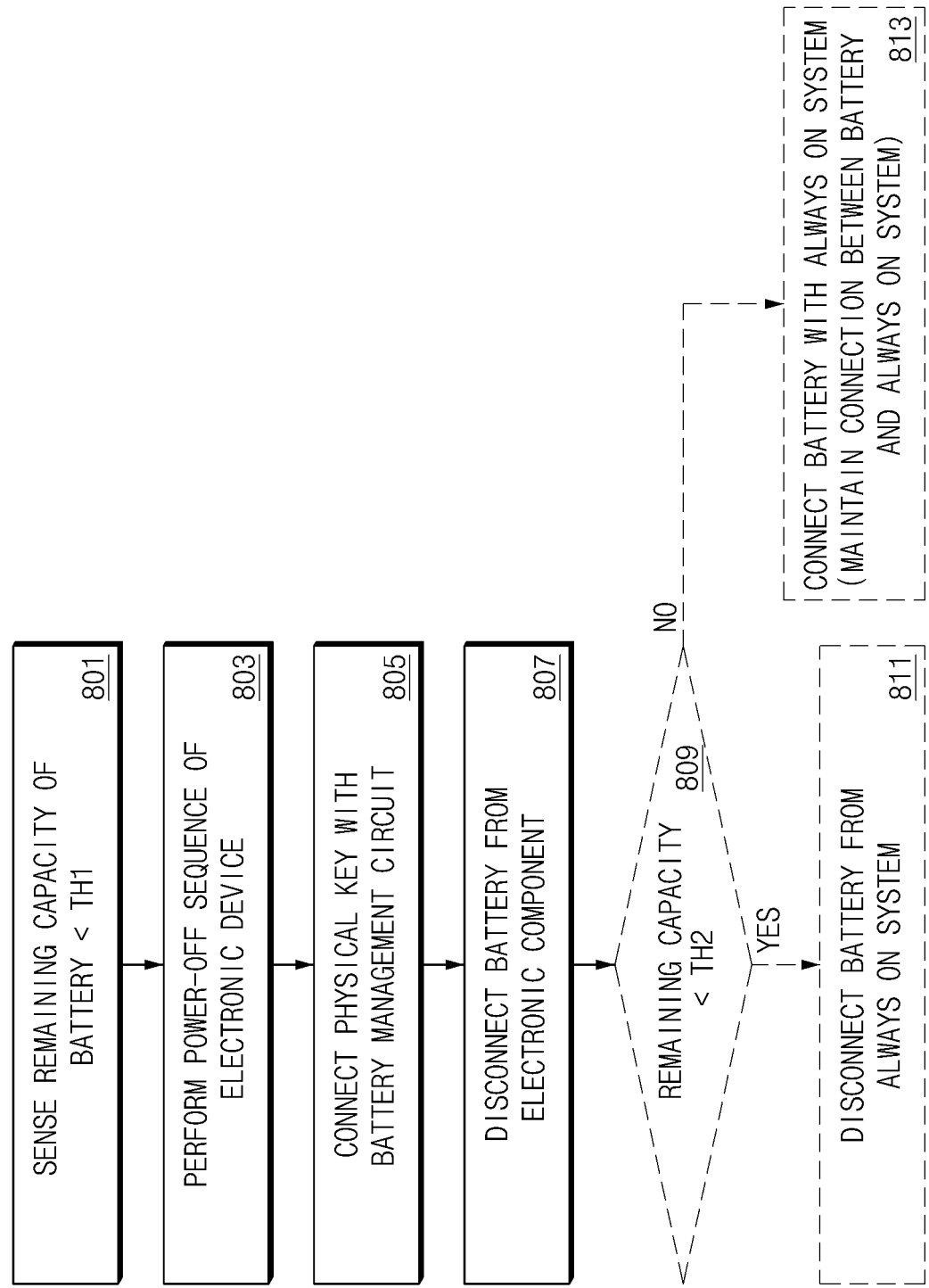
FIG. 8 is a flowchart illustrating an automatic power-off process when the remaining capacity of a battery is at a specific level or less, according to an embodiment.
Figure 9A:
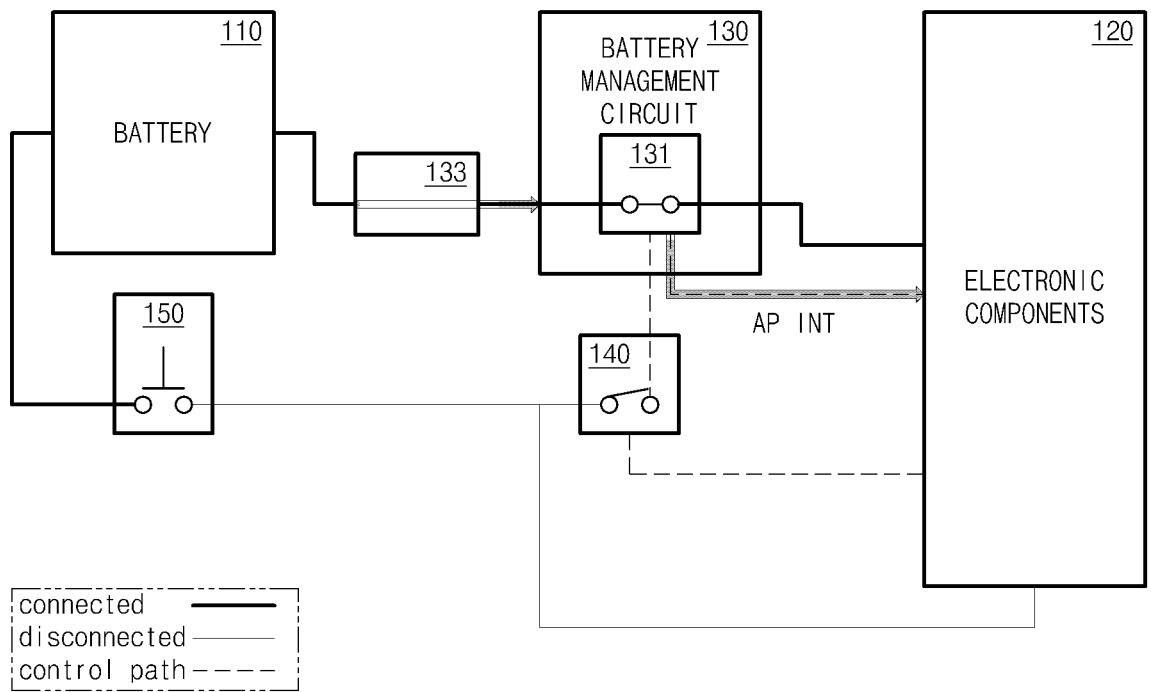
FIG. 9A is a schematic diagram illustrating a circuit configuration when the remaining capacity of a battery is the specific level or less according to an embodiment, where the electronic device does not have an always on system.
Figure 9B:
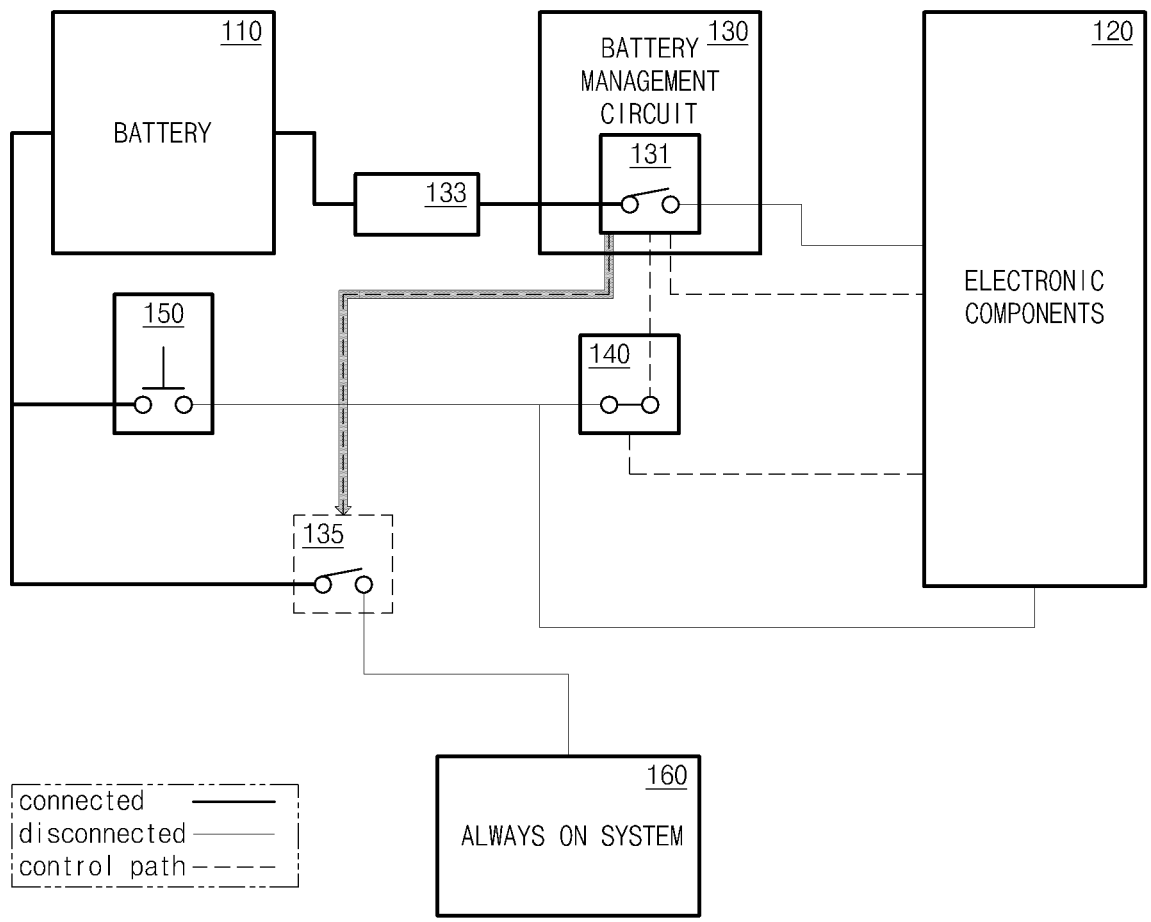
FIG. 9B is a schematic diagram illustrating a circuit configuration when the remaining capacity of the battery is the specific level or less according to an embodiment, where the electronic device has an always on system.

FIG. 8 is a flowchart illustrating an automatic power-off process when the remaining capacity of the battery 110 is at the specific level or less, according to an embodiment. FIG. 9A is a schematic diagram illustrating a circuit configuration when the remaining capacity of the battery 110 is the specific level or less according to an embodiment, where the electronic device 100 does not have an always on system. FIG. 9B is a schematic diagram illustrating a circuit configuration when the remaining capacity of the battery 110 is the specific level or less according to another embodiment, where the electronic device 100 has an always on system.

Referring to FIG. 8, in operation 801, the electronic device 100 may determine whether the remaining capacity of the battery 110 is less than a first threshold (TH1). For example, the monitoring circuit 133 of the electronic device 100 may monitor the voltage and/or the current of the battery 110 and may determine whether the remaining capacity of the battery 110 is less than the first threshold TH1 for ensuring the stability the battery 110 or the electronic device 100.

If so, referring to FIG. 9A, the monitoring circuit 133 may provide, to the battery management circuit 130, a message or an interrupt representing that the remaining capacity of the battery 110 is less than the first threshold. The battery management circuit 130 may provide an interrupt (e.g., AP INT) for power-off to the at least one processor 121 (e.g., AP) in response to the message or the interrupt. Subsequently, the at least one processor 121 may power off the electronic device 100, as described above with reference to FIG. 3.

Referring back to FIG. 8, the electronic device 100 may perform operations 803, 805, and 807. Since operations 803, 805, and 807 correspond to operations 303, 305, and 307 of FIG. 3, the details thereof will be omitted. According to an embodiment, when operations 803, 805, and 807 are performed, the state of the electronic device 100 without an always on system 160 is shown in FIG. 4. The process of FIG. 8 may be automatically performed based on the remaining capacity of the battery 110.

According to another embodiment, when the electronic device 100 includes the always on system 160 as illustrated in FIG. 9B, operations 809, 811, and 813 may be performed. For example, in operation 809, the electronic device 100 may determine whether the remaining capacity of the battery 110 is less than a second threshold value. In this case, the second threshold value may be set to a value less than the first threshold value. As such, when the remaining capacity of the battery 110 is less than the first threshold value (TH1), the electronic device 100 is automatically powered off to protect the electronic components 120, but the operation of the always on system 160 may be maintained. However, because the always on system 160 is still operating, the remaining capacity of the battery 110 is still continuously reduced. When the remaining capacity of the battery 110 reaches a level than is lower than the second threshold value (TH2), the electronic device 100 may open the second switch 135 to disconnect the battery 110 and the always on system 160. However, if the remaining capacity of the battery 110 is above the second threshold value, the electronic device 100 may maintain the connecting state of the second switch 135 so that power is supplied to the always on system 160.

According to another embodiment, the electronic device may implement two different powered-off modes or states. The first is a fully powered-off state, which is previously described with reference to FIG. 4. The second may be referred to as a normal powered-off state, where even if the electronic device 100 is powered off, the battery management circuit 130 and the key control circuit 140 may be connected, same as when the electronic device 100 is powered-on. In the normal powered-off state, the battery 110 may be connected to the electronic components 120 such that the voltage of the battery 110 is gradually lowered due to the leakage current generated from the battery 110.

When the voltage of the battery 110 becomes lower than a threshold value, the electronic device 100 may enter the fully powered-off state from the normal powered-off state. Since in the normal powered-off state the at least one processor 121 is deactivated, in such a state, the battery management circuit 130 may control switch 131 and key control circuit 140 instead of the at least one processor 121.

The details thereof will be described with reference to FIG. 10.

Figure 10:
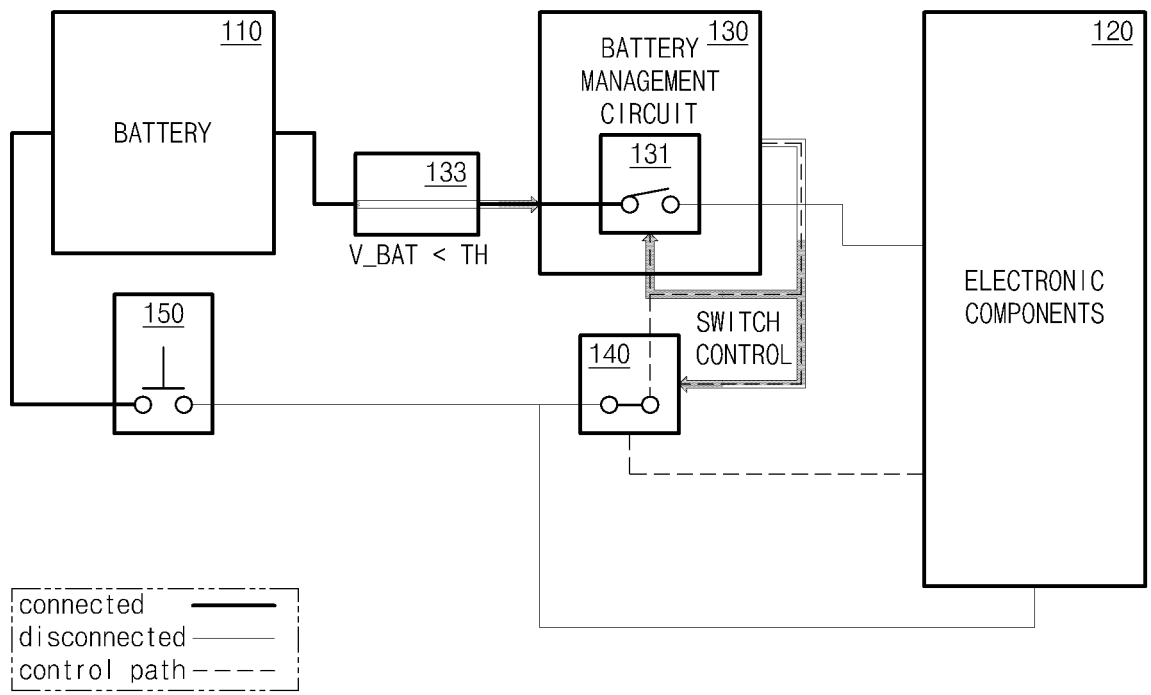
FIG. 10 is a schematic diagram illustrating a circuit configuration when the voltage of a battery of an electronic device is lower than a threshold value, according to an embodiment.

FIG. 10 is a schematic diagram illustrating a circuit configuration when the voltage of the battery 110 of the electronic device 100 is lower than a threshold value, according to an embodiment.

Referring to FIG. 10, when the monitoring circuit 133 detects that the voltage of the battery 110 is lower than a specified value in the normal powered-off state, the monitoring circuit 133 may provide this information to the battery management circuit 130.

According to an embodiment, the battery management circuit 130 may control the BPS 131 and the key control circuit 140. For example, the battery management circuit 130 may disconnect the battery 110 from the electronic components 120 by controlling the BPS 131 to prevent the leakage current from being generated. Alternatively or in addition, the battery management circuit 130 may connect the physical key 150 with the battery management circuit 130 (or the BPS 131) by controlling the key control circuit 140 so that the physical key 150 can control the BPS 131 to re-establish connection.

Figure 11:
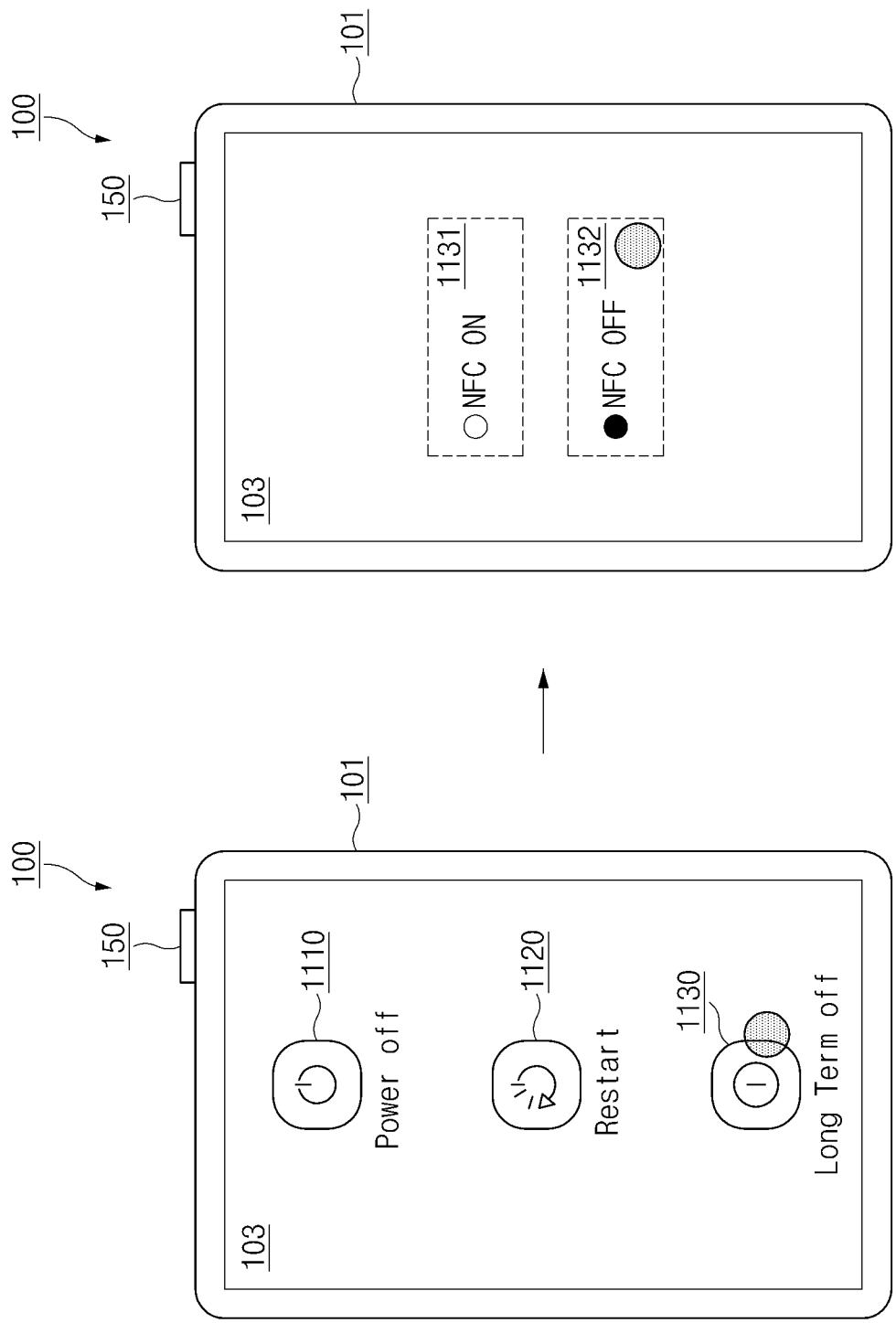
FIG. 11 are views illustrating an example user interface for powering off an electronic device, according to an embodiment.

FIG. 11 are views illustrating an example user interface for powering off the electronic device, according to an embodiment.

Referring to FIG. 11, when the user generates a specific input signal using the physical key 150, or an event of powering off the electronic device 100 occurs through software, a termination UI may be provided as illustrated in the left side of the FIG. 11. For example, the termination UI may include a power off icon 1110, a restart icon 1120, and a long term off icon 1130. However, the termination UI illustrated in FIG. 11 is provided only for the illustrative purpose, and various icons/menus may be added/deleted. For example, the termination UI may further include an icon representing a mode for making only emergency calls.

According to an embodiment, the power off icon 1110 may be selected. If so, the electronic device 100 may perform a series of procedures for powering off the electronic device 100. For example, the electronic device 100 may perform the process of FIG. 3. When the electronic device 100 includes the always on system 160, the electronic device 100 may performs the process of FIG. 8.

According to an embodiment, the long term off icon 1130 may be selected. If so, the electronic device 100 may instantly power off the electronic components 120 and the always on system 160. As described above, the battery 110 may be electrically and physically disconnected from other components. Accordingly, when the electronic device 100 is stored for a long term, the remaining capacity of the battery 110 of the electronic device 100 may be preserved.

According to an embodiment, when the long term off icon 1130 is selected, an UI for selectively powering off the always on system 160 may be provided. For example, the following description will be made on the assumption that the always on system 160 is an NFC payment system for the convenience of explanation.

Referring to the right side of FIG. 11, there may be provided menus for selectively powering on or off the always on system 160, that is, the NFC payment system. For example, an NFC ON menu 1131 and an NFC OFF menu 1132 may be included at the right side of FIG. 11. When the NFC ON menu 1131 is selected by the user, the electronic device 100 may maintain the connection between the NFC payment system and the battery 110. In this case, even if the electronic device 100 is in the long term powered-off state, the user may perform NFC payments using the electronic device 100. When the NFC OFF menu 1132 is selected by the user, the electronic device 100 may disconnect the NFC payment system from the battery 110.

According to an embodiment, when the electronic device 100 includes a plurality of always on systems, there may be provided a selection menu for selecting which always on system to keep powered on. For example, the electronic device 100 may display a list of a first always on system, a second always on system, and a third always on system. Depending on user selection, the electronic device 100 may be powered off but still provide power to the always on systems selected by the user.

The hardware elements of the electronic device 100 described above with reference to FIGS. 1 to 11 may be expanded with reference to FIGS. 12 and 13 to be described below.

Figure 12:
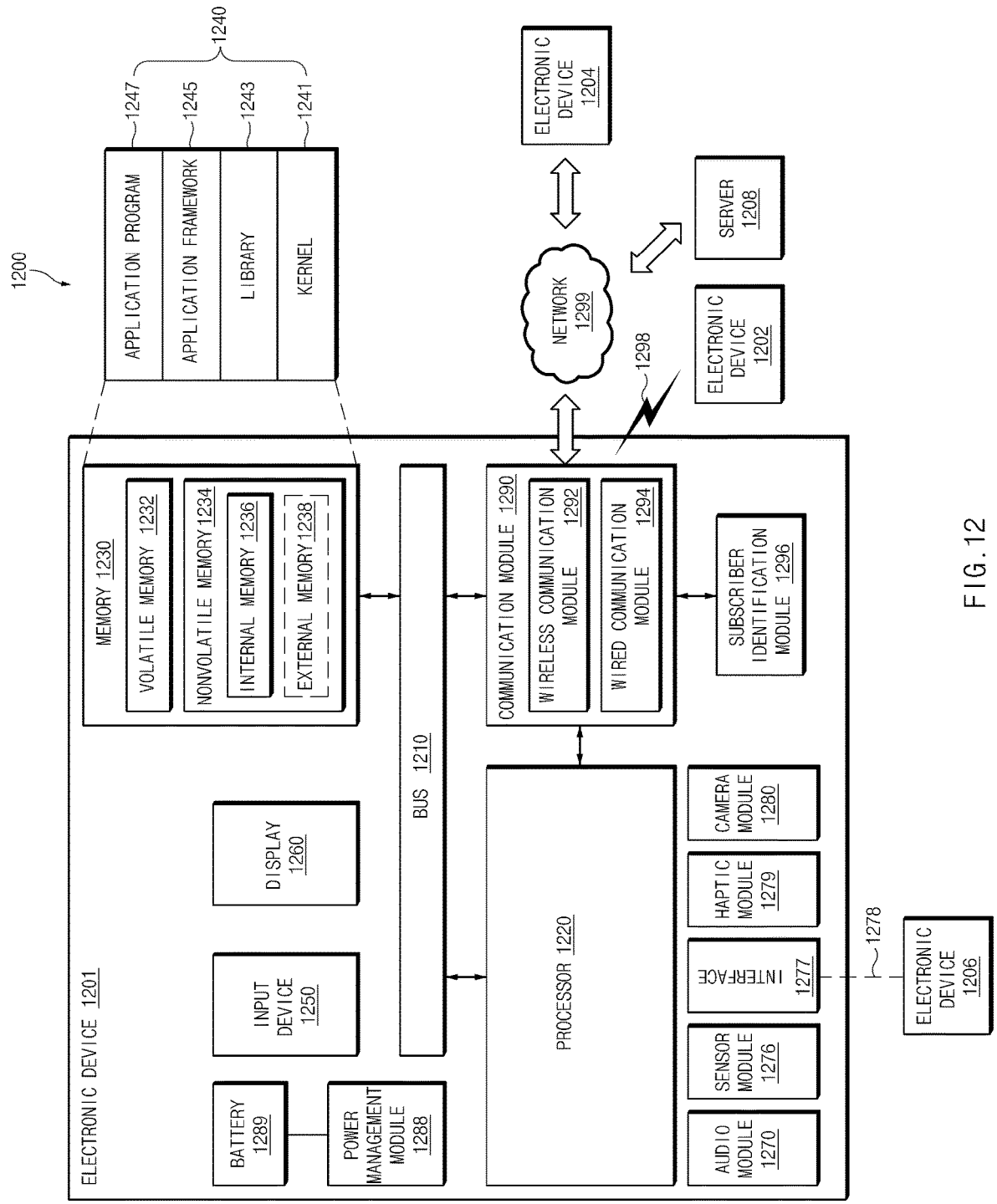
FIG. 12 is a block diagram illustrating an electronic device in a network environment according to an embodiment.

FIG. 12 is a block diagram illustrating an electronic device 1201 in a network environment 1200, according to an embodiment. An electronic device according to various embodiments of this disclosure may include various forms of devices. For example, the electronic device may include at least one of, for example, portable communication devices (e.g., smartphones), computer devices (e.g., personal digital assistants (PDAs), tablet personal computers (PCs), laptop PCs, desktop PCs, workstations, or servers), portable multimedia devices (e.g., electronic book readers or Motion Picture Experts Group (MPEG-1 or MPEG-2) Audio Layer 3 (MP3) players), portable medical devices (e.g., heartbeat measuring devices, blood glucose monitoring devices, blood pressure measuring devices, and body temperature measuring devices), cameras, or wearable devices. The wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disk (DVD) players, audios, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment, the electronic device may include at least one of navigation devices, satellite navigation system (e.g., Global Navigation Satellite System (GNSS)), event data recorders (EDRs) (e.g., black box for a car, a ship, or a plane), vehicle infotainment devices (e.g., head-up display for vehicle), industrial or home robots, drones, automatic teller's machines (ATMs), points of sales (POSs), measuring instruments (e.g., water meters, electricity meters, or gas meters), or internet of things (e.g., light bulbs, sprinkler devices, fire alarms, thermostats, or street lamps). The electronic device according to an embodiment of this disclosure may not be limited to the above-described devices, and may provide functions of a plurality of devices like smartphones which has measurement function of personal biometric information (e.g., heart rate or blood glucose). In this disclosure, the term "user" may refer to a person who uses an electronic device or may refer to a device (e.g., an artificial intelligence electronic device) that uses the electronic device.

Referring to FIG. 12, in the network environment 1200, the electronic device 1201 (e.g., the electronic device 100) may communicate with an electronic device 1202 through local wireless communication 1298 or may communication with an electronic device 1204 or a server 1208 through a network 1299. According to an embodiment, the electronic device 1201 may communicate with the electronic device 1204 through the server 1208.

According to an embodiment, the electronic device 1201 may include a bus 1210, a processor 1220 (e.g., the processor 121), a memory 1230, an input device 1250 (e.g., a micro-phone or a mouse), a display device 1260 (e.g., the display 103), an audio module 1270, a sensor module 1276, an interface 1277, a haptic module 1279, a camera module 1280, a power management module 1288, a battery 1289, a communication module 1290, and a subscriber identification module 1296. According to an embodiment, the electronic device 1201 may not include at least one (e.g., the display device 1260 or the camera module 1280) of the above-described elements or may further include other element(s).

The bus 1210 may interconnect the above-described elements 1220 to 1290 and may include a circuit for conveying signals (e.g., a control message or data) between the above-described elements.

The processor 1220 may include one or more of a central processing unit (CPU), an application processor (AP), a graphic processing unit (GPU), an image signal processor (ISP) of a camera or a communication processor (CP). According to an embodiment, the processor 1220 may be implemented with a system on chip (SoC) or a system in package (SiP). For example, the processor 1220 may drive an operating system (OS) or an application to control at least one of another element (e.g., hardware or software element) connected to the processor 1220 and may process and compute various data. The processor 1220 may load a command or data, which is received from at least one of other elements (e.g., the communication module 1290), into a volatile memory 1232 to process the command or data and may store the result data into a nonvolatile memory 1234.

The memory 1230 may include, for example, the volatile memory 1232 or the nonvolatile memory 1234. The volatile memory 1232 may include, for example, a random access memory (RAM) (e.g., a dynamic RAM (DRAM), a static RAM (SRAM), or a synchronous DRAM (SDRAM)). The nonvolatile memory 1234 may include, for example, a programmable read-only memory (PROM), an one time PROM (OTPROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 1234 may be configured in the form of an internal memory 1236 or the form of an external memory 1238 which is available through connection only if necessary, according to the connection with the electronic device 1201. The external memory 1238 may further include a flash drive such as compact flash (CF), secure digital (SD), micro secure digital (Micro-SD), mini secure digital (Mini-SD), extreme digital (xD), a multimedia card (MMC), or a memory stick. The external memory 1238 may be operatively or physically connected with the electronic device 1201 in a wired manner (e.g., a cable or a universal serial bus (USB)) or a wireless (e.g., Bluetooth) manner.

For example, the memory 1230 may store, for example, at least one different software element, such as a command or data associated with the program 1240, of the electronic device 1201. The program 1240 may include, for example, a kernel 1241, a library 1243, an application framework 1245 or an application program (interchangeably, "application") 1247.

The input device 1250 may include a microphone, a mouse, or a keyboard. According to an embodiment, the keyboard may include a keyboard physically connected or a virtual keyboard displayed through the display 1260.

The display 1260 may include a display, a hologram device or a projector, and a control circuit to control a relevant device. The screen may include, for example, a liquid crystal display (LCD), a light emitting diode (LED) display, an organic LED (OLED) display, a microelectromechanical systems (MEMS) display, or an electronic paper display. According to an embodiment, the display may be flexibly, transparently, or wearably implemented. The display may include a touch circuitry, which is able to detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 1201.

The audio module 1270 may convert, for example, from a sound into an electrical signal or from an electrical signal into the sound. According to an embodiment, the audio module 1270 may acquire sound through the input device 1250 (e.g., a microphone) or may output sound through an output device (not illustrated) (e.g., a speaker or a receiver) included in the electronic device 1201, an external electronic device (e.g., the electronic device 1202 (e.g., a wireless speaker or a wireless headphone)) or an electronic device 1206 (e.g., a wired speaker or a wired headphone) connected to the electronic device 1201

The sensor module 1276 may measure or detect, for example, an internal operating state (e.g., power or temperature) of the electronic device 1201 or an external environment state (e.g., an altitude, a humidity, or brightness) to generate an electrical signal or a data value corresponding to the information of the measured state or the detected state. The sensor module 1276 may include, for example, at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint senor, a heartbeat rate monitoring (FIRM) sensor, an e-nose sensor, an electromyography (EMG) sensor, an electroencephalogram (EEG) sensor, an electrocardiogram (ECG) sensor), a temperature sensor, a humidity sensor, an illuminance sensor, or an UV sensor. The sensor module 1276 may further include a control circuit for controlling at least one or more sensors included therein. According to an embodiment, the sensor module 1276 may be controlled by using the processor 1220 or a processor (e.g., a sensor hub) separate from the processor 1220. In the case that the separate processor (e.g., a sensor hub) is used, while the processor 1220 is in a sleep state, the separate processor may operate without awakening the processor 1220 to control at least a portion of the operation or the state of the sensor module 1276.

According to an embodiment, the interface 1277 may include a high definition multimedia interface (HDMI), a universal serial bus (USB), an optical interface, a recommended standard 232 (RS-232), a D-subminiature (D-sub), a mobile high-definition link (MHL) interface, a SD card/MMC(multi-media card) interface, or an audio interface. A connector 1278 may physically connect the electronic device 1201 and the electronic device 1206. According to an embodiment, the connector 1278 may include, for example, an USB connector, an SD card/MMC connector, or an audio connector (e.g., a headphone connector).

The haptic module 1279 may convert an electrical signal into mechanical stimulation (e.g., vibration or motion) or into electrical stimulation. For example, the haptic module 1279 may apply tactile or kinesthetic stimulation to a user.

The haptic module 1279 may include, for example, a motor, a piezoelectric element, or an electric stimulator.

The camera module 1280 may capture, for example, a still image and a moving picture. According to an embodiment, the camera module 1280 may include at least one lens (e.g., a wide-angle lens and a telephoto lens, or a front lens and a rear lens), an image sensor, an image signal processor, or a flash (e.g., a light emitting diode or a xenon lamp).

The power management module 1288, which is to manage the power of the electronic device 1201, may constitute at least a portion of a power management integrated circuit (PMIC).

The battery 1289 (e.g., the battery 110) may include a primary cell, a secondary cell, or a fuel cell and may be recharged by an external power source to supply power at least one element of the electronic device 1201.

The communication module 1290 may establish a communication channel between the electronic device 1201 and an external device (e.g., the first external electronic device 1202, the second external electronic device 1204, or the server 1208). The communication module 1290 may support wired communication or wireless communication through the established communication channel. According to an embodiment, the communication module 1290 may include a wireless communication module 1292 or a wired communication module 1294. The communication module 1290 may communicate with the external device through a first network 1298 (e.g. a wireless local area network such as Bluetooth or infrared data association (IrDA)) or a second network 1299 (e.g., a wireless wide area network such as a cellular network) through a relevant module among the wireless communication module 1292 or the wired communication module 1294.

The wireless communication module 1292 may support, for example, cellular communication, local wireless communication, global navigation satellite system (GNSS) communication. The cellular communication may include, for example, long-term evolution (LTE), LTE Advance (LTE-A), code division multiple access (CMA), wideband CDMA (WCDMA), universal mobile telecommunications system (UMTS), wireless broadband (WiBro), or global system for mobile communications (GSM). The local wireless communication may include wireless fidelity (Wi-Fi), WiFi Direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), Beidou Navigation Satellite System (Beidou), the European global satellite-based navigation system (Galileo), or the like. In the present disclosure, "GPS" and "GNSS" may be interchangeably used.

According to an embodiment, when the wireless communication module 1292 supports cellar communication, the wireless communication module 1292 may, for example, identify or authenticate the electronic device 1201 within a communication network using the subscriber identification module (e.g., a SIM card) 1296. According to an embodiment, the wireless communication module 1292 may include a communication processor (CP) separate from the processor 1220 (e.g., an application processor (AP)). In this case, the communication processor may perform at least a portion of functions associated with at least one of elements 1210 to 1296 of the electronic device 1201 in substitute for the processor 1220 when the processor 1220 is in an inactive (sleep) state, and together with the processor 1220 when the processor 1220 is in an active state. According to an embodiment, the wireless communication module 1292 may include a plurality of communication modules, each supporting only a relevant communication scheme among cellular communication, local wireless communication, or a GNSS communication.

The wired communication module 1294 may include, for example, include a local area network (LAN) service, a power line communication, or a plain old telephone service (POTS).

For example, the first network 1298 may employ, for example, Wi-Fi direct or Bluetooth for transmitting or receiving commands or data through wireless direct connection between the electronic device 1201 and the first external electronic device 1202. The second network 1299 may include a telecommunication network (e.g., a computer network such as a LAN or a WAN, the Internet or a telephone network) for transmitting or receiving commands or data between the electronic device 1201 and the second electronic device 1204.

According to various embodiments, the commands or the data may be transmitted or received between the electronic device 1201 and the second external electronic device 1204 through the server 1208 connected with the second network 1299. Each of the first and second external electronic devices 1202 and 1204 may be a device of which the type is different from or the same as that of the electronic device 1201. According to various embodiments, all or a part of operations that the electronic device 1201 will perform may be executed by another or a plurality of electronic devices (e.g., the electronic devices 1202 and 1204 or the server 1208). According to an embodiment, in the case that the electronic device 1201 executes any function or service automatically or in response to a request, the electronic device 1201 may not perform the function or the service internally, but may alternatively or additionally transmit requests for at least a part of a function associated with the electronic device 1201 to any other device (e.g., the electronic device 1202 or 1204 or the server 1208). The other electronic device (e.g., the electronic device 1202 or 1204 or the server 1208) may execute the requested function or additional function and may transmit the execution result to the electronic device 1201. The electronic device 1201 may provide the requested function or service using the received result or may additionally process the received result to provide the requested function or service. To this end, for example, cloud computing, distributed computing, or client-server computing may be used.

Figure 13:
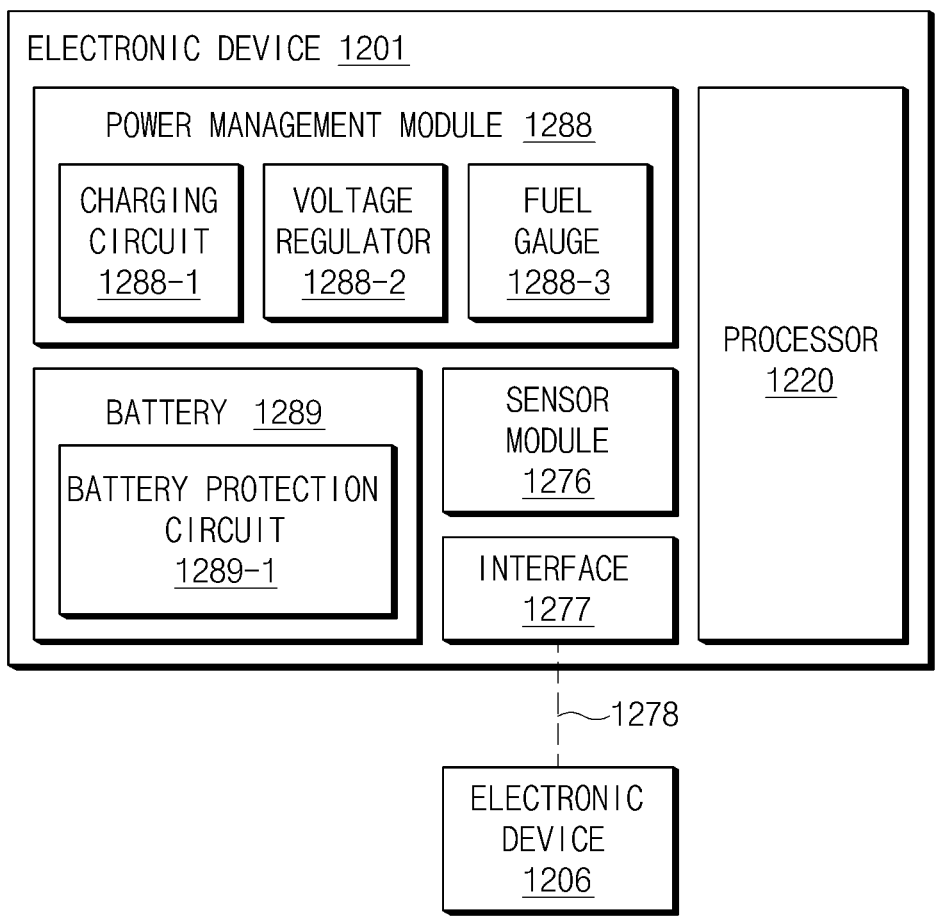
FIG. 13 is a block diagram illustrating a power management module and a battery of an electronic device, according to an embodiment.

FIG. 13 is a block diagram illustrating the power management module 1288 and the battery 1289 of the electronic device 1201, according to an embodiment.

Referring to FIG. 13, according to an embodiment, the power management module 1288 may include a charging circuit 1288-1, a voltage regulator 1288-2, and a fuel gauge 1288-3. The power management module 1288 may not include some of the shown elements (e.g., the fuel gauge 1288-3) or may additionally include other elements not shown. According to an embodiment, the charging circuit 1288-1, the voltage regulator 1288-2, or the fuel gauge 1288-3 may be configured separately from the power management module 1288.

The charging circuit 1288-1 may perform fast charging for the battery 1289, depending on the type of the external electronic device 1206 (e.g., an external charging device) and/or the power (e.g., about 20 watt or more) received from the external electronic device 1206.

The voltage regulator 1288-2 may generate power having various voltage levels and may provide the generated power to elements 1210 to 1296 included in an electronic device 1201. According to an embodiment, the voltage regulator 1288-2 may include a low drop out (LDO) regulator or a switching regulator.

The fuel gauge 1288-3 may measure, for example, first state information (e.g., the capacity of the battery 1289, the number of times that the battery 1289 is charged or discharged, the temperature of the battery 1289 or a voltage of the battery 1289) of the battery 1289.

The power management module 1288 may determine second state information (e.g., the lifespan, overvoltage, undervoltage, overcurrent, overcharging, overheating, shorting, or swelling) of the battery 1289 based on at least a portion of the first state information.

The processor 1220 may control at least some functions of the power management module 1288 or at least some sub elements (e.g., the charging circuit 1288-1) of the power management module 1288 based on at least a portion of the second state information. According to an embodiment, the processor 1220 may determine whether the battery 1289 is in abnormal or normal states, based on at least a portion of the second state information. When it is determined that the battery 1289 is in an abnormal state, the processor 1220 may control the charging circuit 1288-1 to reduce the charging current or to stop charging, for example.

According to an embodiment, the battery 1289 may include a protection circuit module (PCM) 1289-1 to reduce the deterioration of the battery 1289. The protection circuit module 1289-1 may perform, for example, a first operation when overvoltage, overcurrent, overheating, over-discharging or shorting of the battery 1289 is detected. The first operation may protect the battery 1289 from being damaged. According to another embodiment, the protection circuit module 1289-1 may constitute at least a part of a battery management system (BMS) to perform cell balancing or measure the capacity of the battery 1289, the number of times that the battery 1289 is charged or discharged, the temperature of the battery 1289, or a voltage of the battery 1289 in addition to the protection of the battery 1289 from being burned.

A sensor module 1276 may measure the state of the battery 1289 independently from the fuel gauge 1288-3 (e.g., alternatively or additionally to the fuel gauge 1288-3). According to an embodiment, the sensor module 1276 may constitute a part of the protection circuit module 1289-1 or may be configured as a module (e.g., the monitoring circuit 133) separate from the protection circuit module 1289-1 and disposed adjacent to the battery 1289.

An interface 1277 may receive data or power from the external electronic device 1206 (for example when the external electronic device 1206 is a power adaptor, a power charger, or an external battery) or may provide data or power to the external electronic device 1206 (for example when the external electronic device 1206 is a portable communication device or a wearable device). According to an embodiment, the interface 1277 may support wired charging (e.g., USB), wireless charging (e.g., using magnetic induction, magnetic resonance, or other electromagnetic methods). According to an embodiment, the interface 1277 may further include an additional circuit for wireless charging, for example a coil loop, a resonant circuit, or a rectifier.

Various embodiments of the present disclosure and terms used herein are not intended to limit the technologies described in the present disclosure to specific embodiments, and it should be understood that the appended claims encompass modifications, equivalents, and/or alternatives of the corresponding embodiments described herein. Terms expressed as singulars may also refer to the plural unless otherwise specified. In the disclosure disclosed herein, the expressions "A or B," "at least one of A and/or B," "at least one of A and/or B," "A, B, or C," or "at least one of A, B, and/or C," and the like used herein may include any and all combinations of one or more of the associated listed items. Expressions such as "first," or "second," and the like may refer to corresponding components without implying an order of importance, and are used merely to distinguish each component from the others without unduly limiting the components. When an (e.g., first) element is referred to as being "(operatively or communicatively) coupled with/to" or "connected to" another (e.g., second) element, it may be directly coupled with/to or connected to the other element or an intervening element (e.g., a third element) may be present.

According to the situation, the expression "adapted to or configured to" used herein may be interchangeably used as, for example, the expression "suitable for," "having the capacity to," "made to," "capable of," or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing corresponding operations or a generic-purpose processor (e.g., a central processing unit (CPU) or an application processor) which performs corresponding operations by executing one or more software programs which are stored in a memory device (e.g., the memory 1230).

The term "module" used herein may include a unit, which is implemented with hardware, software, or firmware, and may be interchangeably used with the terms "logic", "logical block," "component," "circuit," or the like. The "module" may be an integrated component or a part thereof for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media (e.g., the memory 1230) in the form of a program module. The instruction, when executed by a processor (e.g., a processor 1220), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each element (e.g., a module or a program module) according to various embodiments may be composed of single entity or a plurality of entities, a part of the above-described sub-elements may be omitted or may further include other sub-elements. Alternatively or additionally, after being integrated in one entity, some elements (e.g., a module or a program module) may identically or similarly perform the function executed by each corresponding element before integration. According to various embodiments, operations executed by modules, program modules, or other elements may be executed by a successive method, a parallel method, a repeated method, or a heuristic method, or at least one part of operations may be executed in different sequences or omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

Certain aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

What is claimed is:

1. An electronic device comprising:
   a power management circuit configured to supply power from a battery to one or more electronic components included in the electronic device;
   a battery management circuit comprising a first switch, the first switch configured to control connection between the battery and the power management circuit;
   a physical key formed on a part of the electronic device;
   a second switch configured to control connection between the physical key and the battery management circuit, wherein when the second switch connects the physical key to the battery management circuit, the physical key controls the first switch and when the second switch disconnects the physical key from the battery management circuit, the physical key is inhibited from controlling the first switch; and
   a processor connected to the power management circuit, wherein the processor is configured to:
      transmit a signal for powering off the electronic device to the power management circuit; and
      when the electronic device is powered off, control the key control circuit to connect the physical key with the battery management circuit, and
   wherein the power management circuit is configured to:
      when receiving the signal for powering off the electronic device, control the battery management circuit to disconnect the battery from the power management circuit.

2. The electronic device of claim 1, wherein when the electronic device is powered on, the processor is further configured to control the second switch to disconnect the physical key from the battery management circuit.

3. The electronic device of claim 1, wherein the second switch is configured to:
   detect an input signal from the physical key;
   when the physical key is connected to the battery management circuit, transmit the input signal to the battery management circuit; and
   when the physical key is disconnected from the battery management circuit, transmit the input signal to the processor.

4. The electronic device of claim 1, further comprising:
   another electronic component connected to the battery through another control circuit instead of the battery management circuit,
   wherein the battery management circuit or the processor is further configured to:
      when the electronic device is powered off, and when a specified condition is satisfied, control the another control circuit to disconnect the battery from the another electronic component; and
      when the specified condition is not satisfied, control the another control circuit to maintain connection between the battery and the another electronic component.

5. The electronic device of claim 4, wherein the battery management circuit or the processor is further configured to:
   control the other control circuit to maintain the connection between the battery and the other electronic component regardless of whether the electronic device is powered on or off.

6. An electronic device comprising:
   a housing;
   a physical key having at least a part coupled to the housing;
   one or more electronic components including at least one processor;
   a battery configured to supply power to the one or more electronic components;
   a battery management circuit configured to control connection between the battery and the one or more electronic components; and
   a key control circuit configured to control connection between the physical key and the battery management circuit,
   wherein the at least one processor is configured to:
      control the key control circuit to connect the physical key with the battery management circuit, in response to occurrence of a specified event; and
      control the battery management circuit to disconnect the battery from the one or more electronic components, and
   wherein the battery management circuit is configured to:
      in response to a first input signal from the physical key, connect the battery with the one or more electronic components or disconnect the battery from the one or more electronic components; and
      in response to a second input signal from the physical key after the electronic device is powered off, connect the battery with the one or more electronic components.

7. The electronic device of claim 6, wherein the at least one processor is further configured to determine that the specified event has occurred when the first input signal is maintained for a specified time or more.

8. The electronic device of claim 6, further comprising:
   a display,
   wherein the at least one processor is further configured to determine that the specified event has occurred when a power-off input is entered through a user interface displayed on the display.

9. The electronic device of claim 6, wherein the at least one processor is further configured to control the key control circuit to disconnect the physical key from the battery management circuit when the electronic device is powered on.

10. The electronic device of claim 6, wherein the at least one processor is further configured to control the key control circuit to disconnect the physical key from the battery management circuit when the first input signal is received after the electronic device is powered off and is maintained for a specified time.

11. The electronic device of claim 6, wherein the at least one processor is further configured to determine that the specified event has occurred when a remaining capacity of the battery is lower than a specified threshold value.

12. The electronic device of claim 6, further comprising: another electronic component connected to the battery through a switch.

13. The electronic device of claim 12, wherein the other electronic component includes a wireless payment system configured to support near field communication (NFC) or magnetic signal transmission (MST).

14. The electronic device of claim 12, wherein the other electronic component is configured to be connected to the battery through the switch regardless of whether the specified event occurs.

15. The electronic device of claim 12, wherein, while the battery is being connected to the other electronic component, and when a remaining capacity of the battery is less than a first specified value, the at least one processor is further configured to:
control the key control circuit to connect the physical key with the battery management circuit; and
control the battery management circuit to disconnect the battery from the one or more electronic components.

16. The electronic device of claim 15, wherein the battery management circuit is further configured to control the switch to disconnect the battery from the other electronic component, when the remaining capacity of the battery is less than a second specified value, the second specified value being less than the first specified value.

17. An electronic device comprising:
a housing;
a physical key having at least a part coupled to the housing;
one or more electronic components including a processor;
a battery configured to supply power to the one or more electronic components;
a battery management circuit configured to control connection between the battery and the one or more electronic components; and
a key control circuit configured to control connection between the physical key and the battery management circuit,
wherein, when a specified condition is satisfied and the electronic device is powered off, the battery management circuit is configured to:
control the key control circuit to connect the physical key with the battery management circuit; and
disconnect the battery from the one or more electronic components, wherein, when the battery is disconnected from the one or more electronic components, the battery management circuit is further configured to connect the battery with the one or more electronic components based at least partially on an input signal obtained from the physical key.

18. The electronic device of claim 17, wherein the battery management circuit is further configured to determine the specified condition is satisfied when a voltage of the battery is lower than a specified value.

19. An electronic device comprising:
a housing;
a physical key having at least a part coupled to the housing;
one or more electronic components including at least one processor;
a battery configured to supply power to the one or more electronic components;
a battery management circuit comprising a first switch, the first switch configured to control connection between the battery and the one or more electronic components; and
a second switch configured to control connection between the physical key and the battery management circuit, wherein when the second switch connects the physical key to the battery management circuit, the physical key controls the first switch and when the second switch disconnects the physical key from the battery management circuit, the physical key is inhibited from controlling the first switch,
wherein the at least one processor is configured to:
control the second switch to connect the physical key with the battery management circuit, in response to occurrence of a specified event; and
control the battery management circuit to disconnect the battery from the one or more electronic components, and
wherein the battery management circuit is configured to:
in response to a first input signal from the physical key, connect the battery with the one or more electronic components or disconnect the battery from the one or more electronic components.

20. An electronic device comprising:
a housing;
a physical key having at least a part coupled to the housing;
one or more electronic components including a processor;
a battery configured to supply power to the one or more electronic components;
a battery management circuit comprising a first switch, the first switch configured to control connection between the battery and the one or more electronic components; and
a second switch configured to control connection between the physical key and the battery management circuit,
wherein, when a specified condition is satisfied and the electronic device is powered off, the battery management circuit is configured to:
control the second switch to connect the physical key with the battery management circuit, wherein the physical key controls the first switch; and
disconnect the battery from the one or more electronic components, and
wherein, when the electronic device is powered on, the electronic device is powered on, the second switch disconnects the physical key from the battery management circuit, thereby preventing the physical key from controlling the first switch.

* * * * *